United States Patent
Russ et al.

(10) Patent No.: US 10,332,871 B2
(45) Date of Patent: Jun. 25, 2019

(54) AREA-EFFICIENT AND ROBUST ELECTROSTATIC DISCHARGE CIRCUIT

(71) Applicant: Intel IP Corporation, Santa Clara, CA (US)

(72) Inventors: Christian Cornelius Russ, Diedorf (DE); Giuseppe Curello, Munich (DE); Tomasz Biedrzycki, Nürnberg (DE); Franz Kuttner, Ulrich (AT); Luis F. Giles, Neubiberg (DE); Bernhard Stein, Puchheim (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/073,950

(22) Filed: Mar. 18, 2016

(65) Prior Publication Data

US 2017/0271322 A1 Sep. 21, 2017

(51) Int. Cl.
  *H01L 27/02* (2006.01)
  *H01L 23/367* (2006.01)
  *H01L 23/50* (2006.01)
  *H01L 23/522* (2006.01)
  *H01L 49/02* (2006.01)
  *H01L 27/06* (2006.01)
  (Continued)

(52) U.S. Cl.
  CPC ........ *H01L 27/0285* (2013.01); *H01L 23/367* (2013.01); *H01L 23/3677* (2013.01); *H01L 23/50* (2013.01); *H01L 23/5226* (2013.01); *H01L 23/5228* (2013.01); *H01L 28/00* (2013.01); *H01L 27/0629* (2013.01); *H01L 27/0924* (2013.01); *H02H 9/046* (2013.01)

(58) Field of Classification Search
  CPC .......................... H01L 27/0285; H01L 23/367
  See application file for complete search history.

(56) References Cited

U.S. PATENT DOCUMENTS 7,839,612 B1 * 11/2010 Chan .................. H01L 27/0285
                                                           361/56
2005/0185351 A1    8/2005  Miller et al.
(Continued)

FOREIGN PATENT DOCUMENTS

KP     1020140145263      12/2014

OTHER PUBLICATIONS

Mergens et al., "Multi-finger turn-on circuits and design techniques for enhanced ESD performance and width-scaling", Electrical Overstress/Electrostatic Discharge Symposium, Sep. 11-13, 2001, Portland, OR, USA, pp. 1-11.

(Continued)

*Primary Examiner* — Wael M Fahmy
*Assistant Examiner* — Sarah K Salerno
(74) *Attorney, Agent, or Firm* — Green, Howard & Mughal LLP

(57) ABSTRACT

Described is an apparatus which comprises: a pad; a first transistor coupled in series with a second transistor and coupled to the pad; and a self-biasing circuit to bias the first transistor such that the first transistor is to be weakly biased during an electrostatic discharge (ESD) event. Described is also an apparatus which comprises: a first transistor; and a first local ballast resistor formed of a trench contact (TCN) layer, the first local ballast resistor having a first terminal coupled to either the drain or source terminal of the first transistor.

23 Claims, 13 Drawing Sheets

(51) Int. Cl.
*H01L 27/092* (2006.01)
*H02H 9/04* (2006.01)

(56) References Cited

U.S. PATENT DOCUMENTS

| | | | | |
|---|---|---|---|---|
| 2007/0262386 | A1* | 11/2007 | Gossner | H01L 27/0262 |
| | | | | 257/355 |
| 2007/0267700 | A1* | 11/2007 | Russ | H01L 27/0255 |
| | | | | 257/355 |
| 2009/0174973 | A1* | 7/2009 | Khazhinsky | H01L 27/0285 |
| | | | | 361/56 |
| 2010/0151621 | A1 | 6/2010 | Hirakata et al. | |
| 2010/0163995 | A1 | 7/2010 | Gossner et al. | |
| 2015/0303955 | A1* | 10/2015 | Lin | H03H 11/1213 |
| | | | | 455/179.1 |
| 2016/0064373 | A1* | 3/2016 | Narita | H01L 23/5221 |
| | | | | 257/360 |

OTHER PUBLICATIONS

International Search Report & Written Opinion dated Apr. 28, 2017, for PCT Patent Application No. PCT/US17/16053.
International Preliminary Report on Patentability from PCT/US2017/016053 dated Sep. 27, 2018, 10 pgs.

* cited by examiner

AREA-EFFICIENT AND ROBUST ELECTROSTATIC DISCHARGE CIRCUIT

BACKGROUND

Electrostatic discharge (ESD) is the sudden discharge of electric charge between two electrically charged nodes (e.g., Input-Output (IO) pins coupled to an Integrated Circuit (IC)). This sudden discharge typically produces a large current that passes through the IC in a short duration of time, which may result in damage or destruction of the IC, if not properly handled or protected. This large current is bypassed by circuits called ESD protection circuits. Typically, an ESD protection circuit provides a current path to ground and/or supply when an ESD event occurs so that the high current resulting from the ESD event bypasses the ESD sensitive circuitry in the IC.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
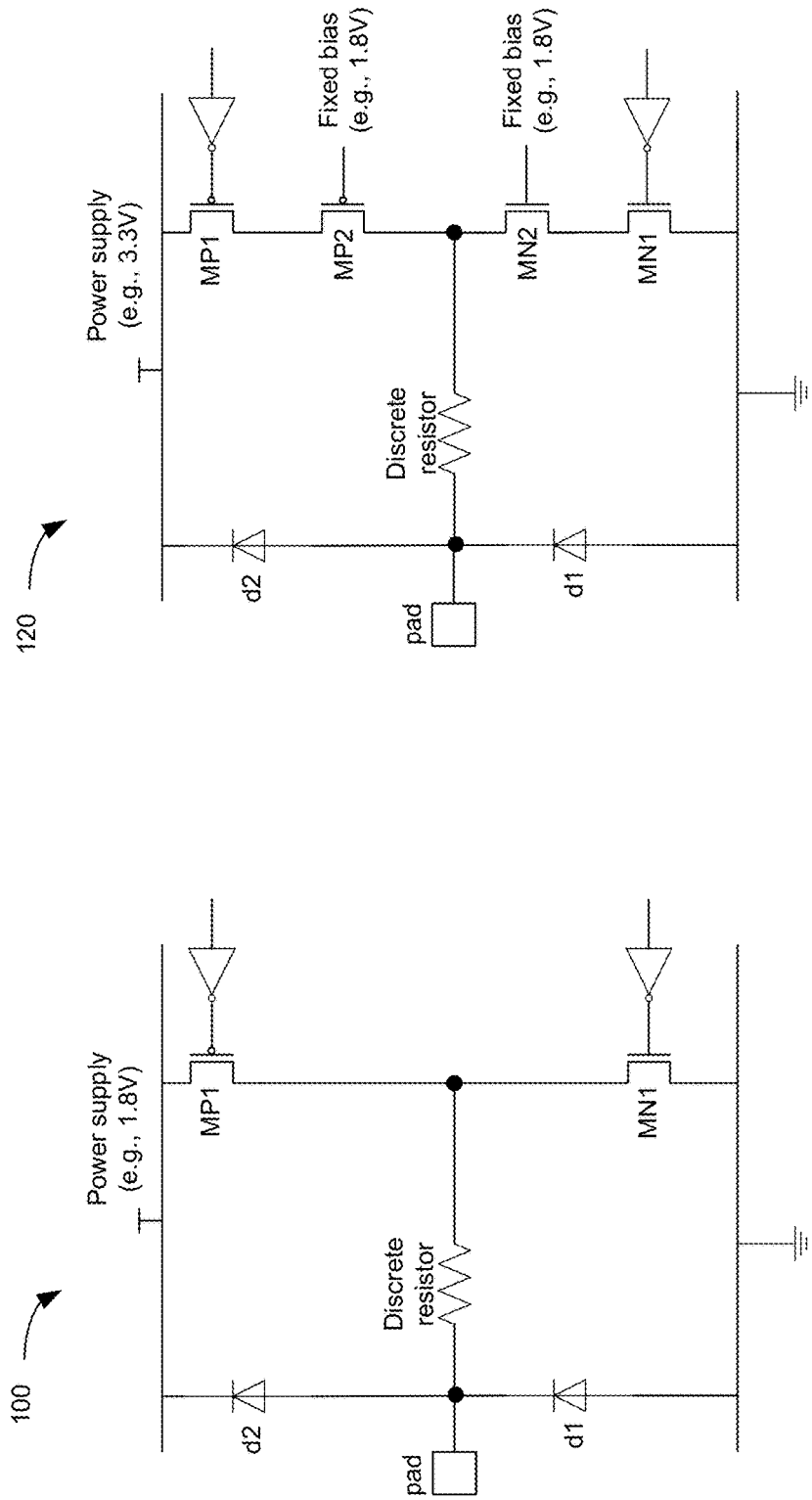
FIGS. 1A-B illustrate part of an electrostatic discharge (ESD) input-output (IO) driver using discrete resistor ballasts.

FIGS. 1A-B illustrate part of electrostatic discharge (ESD) resistant IO drivers 100 and 120, respectively, using discrete resistor ballasts. Drivers 100 and 120 illustrates diodes d1 and d2 such that the anode of diode d2 is coupled to a pad (which may be coupled to a pin), the cathode of diode d2 is coupled to a power supply node (e.g., 1.8 V), anode of diode d1 is coupled to ground, and the anode of diode d1 is coupled to the pad. Driver 100 includes two coupled switchable transistors—p-type transistor MP1 and n-type transistor MN1. The drain terminals of transistors MP1 and MN1 are coupled together and to a discrete ballast resistor, which is also coupled to the pad. The p-type transistor MP1 and the n-type transistor MN1 are driven by pre-drivers that are controlled by logic not shown.

Driver 120 is similar to driver 100 except that an additional p-type transistor MP2 is coupled in series with transistor MP1, and an additional n-type transistor MN2 is coupled in series with transistor MN1. Here, transistors MN2 and MP2 are coupled in series such that their drain terminals are coupled together and to a discrete ballast resistor, which is also coupled to the pad. In this example, transistors MP2 and MN2 are biased by a fixed bias (e.g., 1.8 V when the power supply is 3.3 V) to be operational at 3.3 V input-output (IO) signal and supply voltages, while the transistors are natively for 1.8 V and cannot handle higher voltages due to reliability constraints. In other words, the transistors MP2 and MN2 form cascodes with MP1 and MN1, respectively.

Discrete ballast resistors are normally used to limit current localization, thereby increasing the parasitic lateral NPN or PNP bipolar junction transistor (BJT) second breakdown failure current. These ballast resistors (also referred to as drain ballast resistors) are used to achieve tuning of Vt2 for both ESD victim and protection element. Here, the term "Vt2" refers to a voltage at which a device permanently fails due to thermal effects. For an ESD protection element, Vt2 should be higher than the operating voltage (e.g., Vdd or power supply), and It2 should be as high as possible to provide area-efficient ESD protection. Here, the term "It2" refers to the current at which thermal destruction occurs. For an ESD victim element, Vt2 should be higher than Vdd but also higher than the Vt2 of the ESD protection element. In addition, Vt2 for the ESD protection element and the ESD victim element should be lower than the destructive breakdown or gate dielectric reliability limit.

In mature planar technologies, ballast resistance is normally accomplished by silicide blocking on the drain (and source) side(s) of the transistor. Alternatively, conventional metal ballasting is employed using low levels of metals (e.g., Metal layer 1 (M1)) and/or vias as ballasting elements with silicide transistor diffusions. Discrete resistors (as shown in drivers 100 and 120) continue to be the typical mechanism of providing ballast resistance.

However, in advanced (FinFET) technologies, silicide blocking is not feasible due to patterning, process, and cost restrictions. As such, discrete resistors are typically added in series to the transistor drain terminals. These discrete resistors merely generate a voltage drop but provide no substantial improvement in It2. The ESD currents still spread non-uniformly, and may form hot spots, and the devices continue to face early failure due to local damage. Moreover, these discrete resistors are typically accomplished in a large gate pitch for better precision and lower variability. This means that problems are encountered with the implementation in layout in case of a core transistor at a different pitch due the need for a transition region between the different pitches. All in all, the discrete resistors add undesirable overhead in layout footprint area.

Some embodiments describe two mechanisms to tune Vt2 and improve It2. These two mechanisms are referred to as local ballast gate (LBG) and local ballast resistor (LBR). Both these mechanisms result in reduced layout footprint and higher ESD performance thus provide better ESD protection.

In LBG, ballasting is achieved by an additional transistor gate coupled in series with the ESD victim element, in accordance with some embodiments. The basic principle is to skip connection of one or more gate fingers in a stacked MOSFET (Metal Oxide Semiconductor Field Effect Transistor) layout to decrease the current in the effective drain-source path (e.g., achieve a lateral de-bias of the active transistor finger used in the stack which results in a larger average ballast resistance for improved ESD robustness). In some embodiments, an apparatus is provided which comprises: a pad; a first transistor (e.g., LBG) coupled in series with a second transistor (e.g., ESD victim element) and coupled to the pad; and a self-biasing circuit to bias the first transistor such that the first transistor is to be weakly biased during an electrostatic discharge (ESD) event.

In LBR, a pro-elongated contact line is used that extends from each single transistor block to form a local ballast resistor, in accordance with some embodiments. In some embodiments, the contact line may be implemented with trench contact (TCN) and/or gate contact (GCN) materials and may extend in different shapes (e.g. semi-loop, loop, straight line, etc.) before being contacted through vias to metal layers above the TCN and/or GCN materials. As such, the LBR for ballasting exploits the materials for TCN/GCN both in their reacted form (i.e., silicide) and in their non-reacted form (i.e., metallic), in accordance with some embodiments. Silicide is formed in trenches. For instance, a metal (e.g., Co, Ti, Ni, etc.) is deposited which reacts with the silicon diffusions and forms a silicide. Metallic form (e.g., high Ohmic metal resistor region) of TCN/GCN is achieved when the metal (e.g., Co, Ti, Ni, etc.) is deposited by the same process step over an insulator (e.g., Shallow Trench Isolation (STI)). Being in immediate contact to the physical transistor (e.g., each local drain region), in some embodiments, this LBR is more effective than the discrete resistor template connected by a metal line to the drain regions of multiple transistor blocks.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "bottom," "over," "under," and the like in the description and in the claims, if any, are used for descriptive purposes and not necessarily for describing permanent relative positions.

Figure 2:
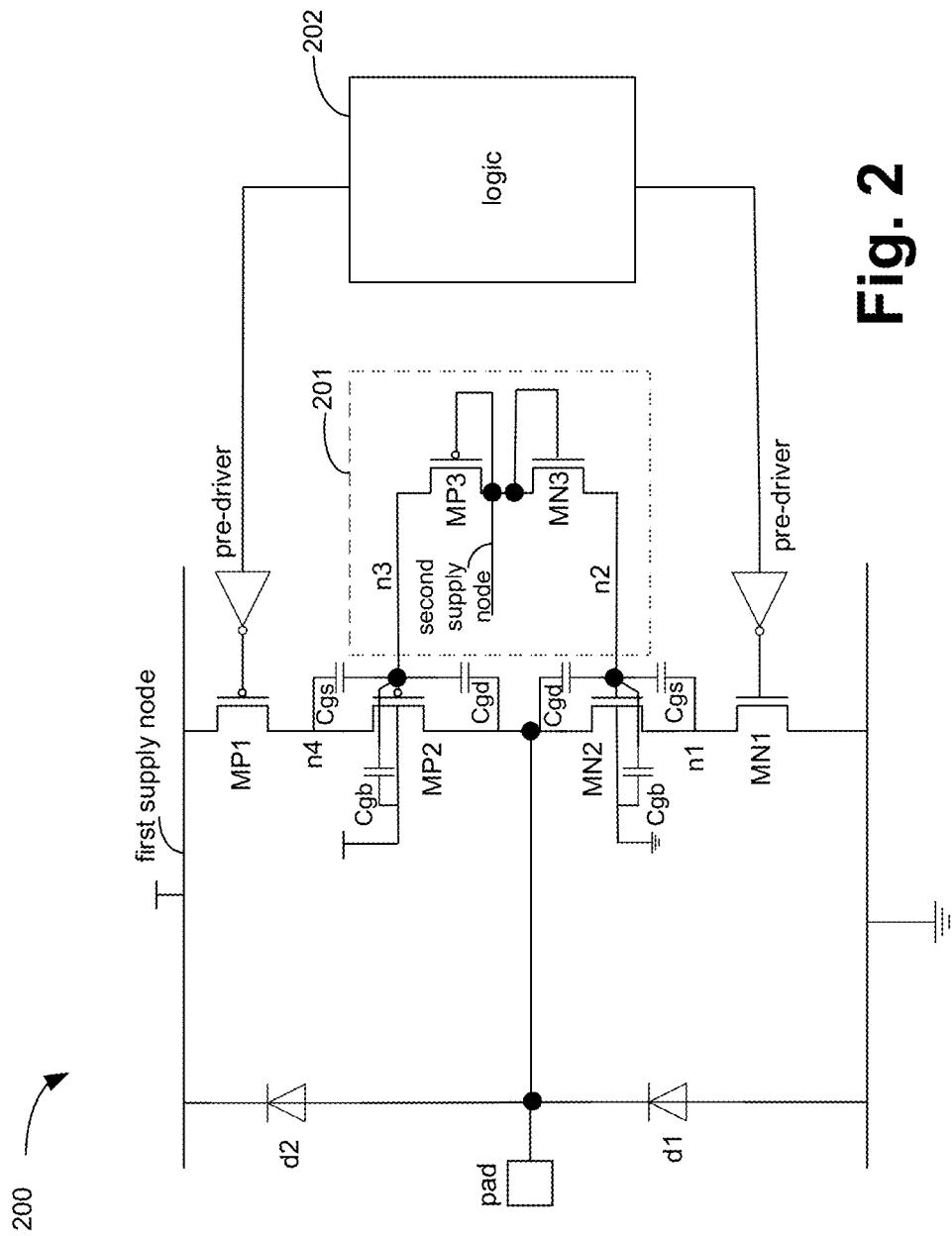
FIG. 2 illustrates a part of an ESD resistant IO driver with local ballast gate devices, according to some embodiments of the disclosure.

FIG. 2 illustrates a part of an ESD resistant I/O driver 200 with LBG devices, according to some embodiments of the disclosure. It is pointed out that those elements of FIG. 2 having the same reference numbers (or names) as the elements of any other figure can operate or function in any manner similar to that described, but are not limited to such.

Driver 200 comprises diodes d1 and d2 and transistors MN1 and MP1 (as described with reference to FIGS. 1A-B), n-type LGB device MN2, p-type LGB device MP2, self-bias circuit 201, and logic 202. Here, the discrete resistor ballast of FIGS. 1A-B is removed. In some embodiments, the n-type LGB device MN2 is coupled in series with an n-type transistor MN1 and also coupled to the pad. In some embodiments, the source terminal (i.e., node n1) of the LGB device MN2 is coupled to the drain terminal of transistor MN1 while the drain terminal of the LGB device MN2 is coupled to the pad and the p-type LGB device MP2. In some embodiments, the p-type LGB device MP2 is coupled in series with the p-type transistor MP1 and also coupled to the pad. Here, the source terminal (i.e., node n4) of the LGB device MP2 is coupled to the drain terminal of transistor MP1 while the drain terminal of the LGB device MP2 is coupled to the pad and the n-type LGB device MN2. In one case, the source terminal of MP1 is coupled to a first power supply node which provides a first power supply (e.g., 3.3 V) while the source terminal of transistor MN1 is coupled to ground.

In some embodiments, self-bias circuit 201 comprises diode connected p-type transistor MP3 and diode connected n-type transistor MN3. A diode connected MOSFET (metal oxide semiconductor field effect transistor) device is a two terminal device which is configured to be in saturation region when a conductive inversion channel is formed, and in blocking mode when an opposite polarity is formed. In some embodiments, the source/drain terminals of the transistors MP3 and MN3 are coupled to the second power supply node. The second power supply node may provide a lower power supply than a power supply provided by the first power supply node. For example, the second power supply is 1.8 V while the first power supply is 3.3 V. In some embodiments, one terminal (i.e., node n3) of the diode connected p-type transistor MP3 is used to bias p-type LGB device MP2. In some embodiments, one terminal (i.e., node n2) of the diode connected n-type transistor MP2 is used to bias n-type LGB device MN2.

In some embodiments, during an ESD event (e.g., when first and second power supplies are absent and a large current or voltage occurs on the pad), capacitive coupling effects (shown by parasitic capacitors Cgs (gate-to-source capacitor), Cgd (gate-to-drain capacitor), and Cbg (gate to bulk capacitor)) provide gate biasing to the quasi-floating gate terminals of LGB devices MP2 and MN2. For example, the voltage on the gate terminal of LGB device MP2 is weakly pulled down or the voltage on the gate terminal of LGB device MN2 is weakly pulled up during an ESD event (depending on the different polarities at which the ESD stress event may occur at the IO pad).

As such, during an ESD event, the LGB devices MP2 and MN2 are weakly biased and provide the ballast resistance without the need for any discrete ballast resistor as shown in FIGS. 1A-B. In some embodiments, the gate bias for transistors MN2 and MP2 may be derived with a capacitive voltage divider. The term "weakly bias" here generally refers to a transistor gate voltage Vgate which is at least a threshold voltage (Vt) which is less than approximately Vdrain/2 (for an n-type transistor), where "Vdrain" is the voltage on the drain terminal of the n-type transistor (e.g., Vt<Vgate<Vdrain/2). In contrast, strongly biased generally refers to a transistor gate voltage which is at least approximately Vdrain/2 less than Vdrain (e.g., Vdrain/2<Vgate<Vdrain). Strongly biased transistor is also a transistor having a gate voltage which is greater than the Vdrain (e.g., Vgate>Vdrain).

Referring back to FIG. 2, during normal operation (e.g., when first and second power supplies are present and providing their expected power supplies), the gate terminals of LGB devices MP2 and MN2 are biased to normal levels (e.g., to 1.8V-Vt) via the diode connect devices (where Vt is a threshold voltage). In some embodiments, logic 202 is any suitable known timing logic which is used to turn on transistors MN1 and MP1 via pre-drivers for transmitting data to the pad.

While the embodiment of FIG. 2 illustrates a full IO driver combination of n-type and p-type transistors (e.g., transistors MN1 and MP1), in some embodiments, one LGB device serves two transistors—n-type transistor coupled to ground and p-type transistor coupled to the power supply. For example, transistor MP2 can be removed and transistor MN2 can couple to transistors MN1 and MP1. In another example, transistor MN2 is removed and transistor MP2 can couple to transistors MN1 and MP1.

Figure 3:
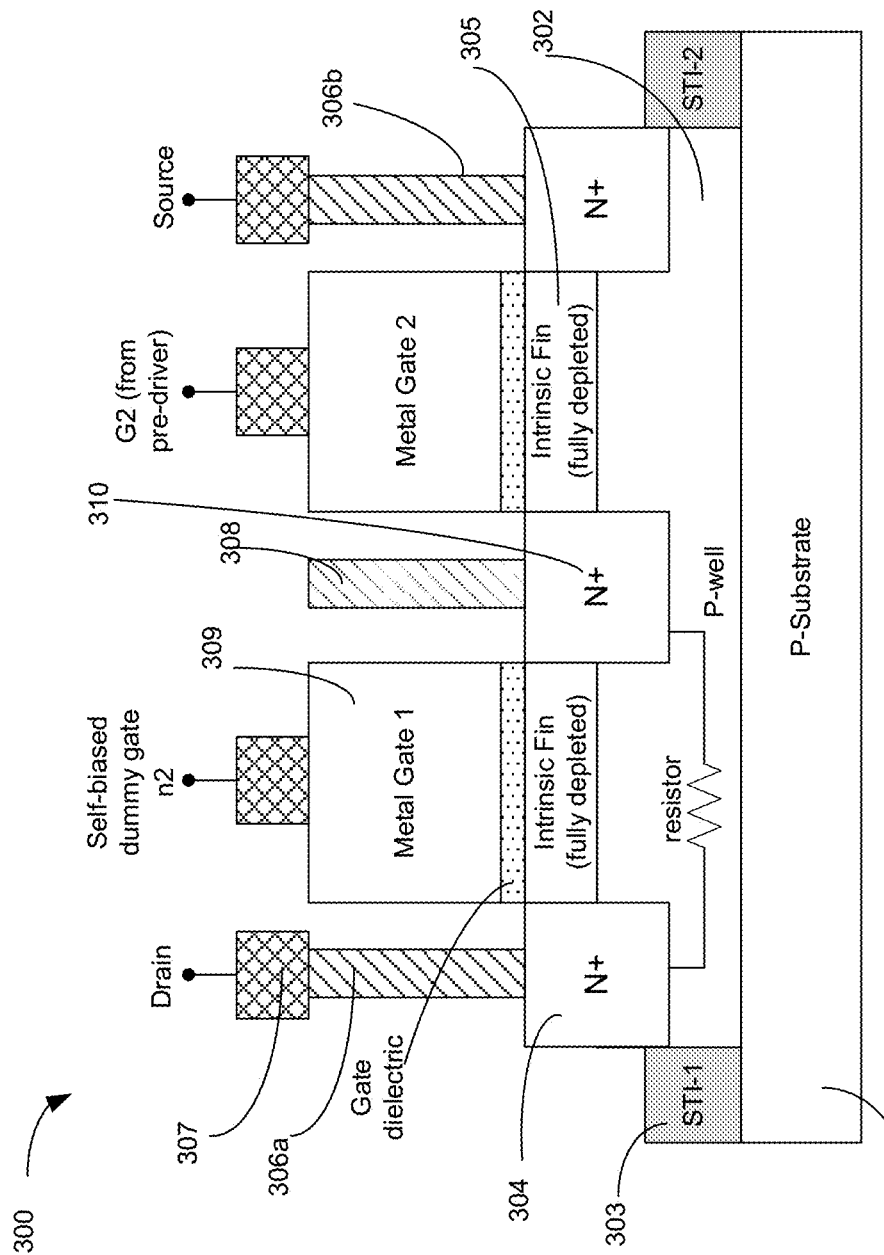
FIG. 3 illustrates a cross-section of two transistors, where one of the transistors is weakly biased to provide local resistance ballast during an ESD event, in accordance with some embodiments of the disclosure.

FIG. 3 illustrates a cross-section view 300 of two transistors, where one of the transistors is weakly biased to provide local gate ballasting during an ESD event, in accordance with some embodiments of the disclosure. It is pointed out that those elements of FIG. 3 having the same reference numbers (or names) as the elements of any other figure can operate or function in any manner similar to that described, but are not limited to such.

Cross-section view 300 illustrates two FinFETs (e.g., transistors MN1 and MN2) P-substrate 301, P-well region 302, shallow trench isolations (STIs) 303, N+ diffusion regions 304, fully depleted intrinsic fins 305; gate dielectric, TCN 306 (306a and 306b), Via contact (VCN) 307, and (dummy) TCN 308 for floating N+ diffusion region 310, and metal gate 309 (e.g., Metal Gate 1 for transistor MN2 and Metal Gate 2 for transistor MN1). In some embodiments, transistor MN1 and transistor MN2 have a shared drain/source region which represents node n1 in FIG. 2.

Referring back to FIG. 3, in some embodiments, the shared N+ diffusion 310 region is floated and may be coupled to trench contact (TCN) layer 308. Here, TCN layer is any suitable layer below a first metal layer or at the same level as the first metal layer that can be used for connecting various nodes. In some embodiments, the gate 309 of LGB device MN2 is weakly turned on (or partially turned on) during an ESD event and fully turned on during normal operation. A device is weakly turned on when it is not fully on (on-state by applying supply level to gate of an n-type transistor) and not fully off (off-state by applying ground level to gate of an n-type transistor).

Compared to the regular stacked MOSFET layout of FIG. 1B where the two channels are either fully off (e.g., grounded-gate NMOS (GGNMOS)) or fully inverted (e.g., gate terminals tied high), the LGB device MN2 can be modeled as if part of the double gate channel is not fully inverted but some current still flows by drift and spreads in a larger volume under the dummy gate rather than being confined in an thin inversion layer right under the gate. This current path is shown by the resistor under the dummy gate. In some aspects, the LGB device MN2 is equivalent to a transistor with an extended drain that provides ballasting for current spreading that leads to higher voltage robustness Vt2 of the device during ESD.

Figure 4A:
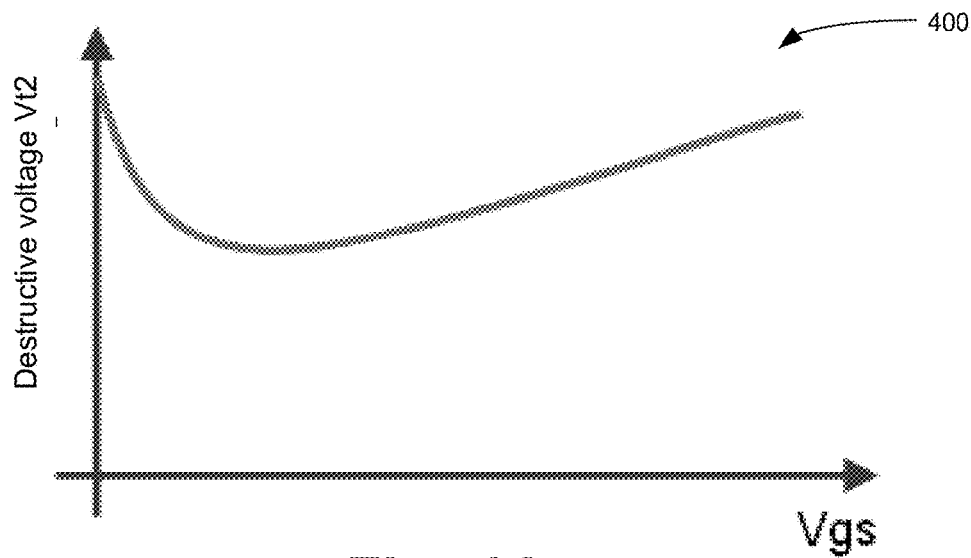
FIG. 4A illustrates a plot showing voltage robustness (Vt2) as a function of gate bias for a conventional planar device.
Figure 4B:
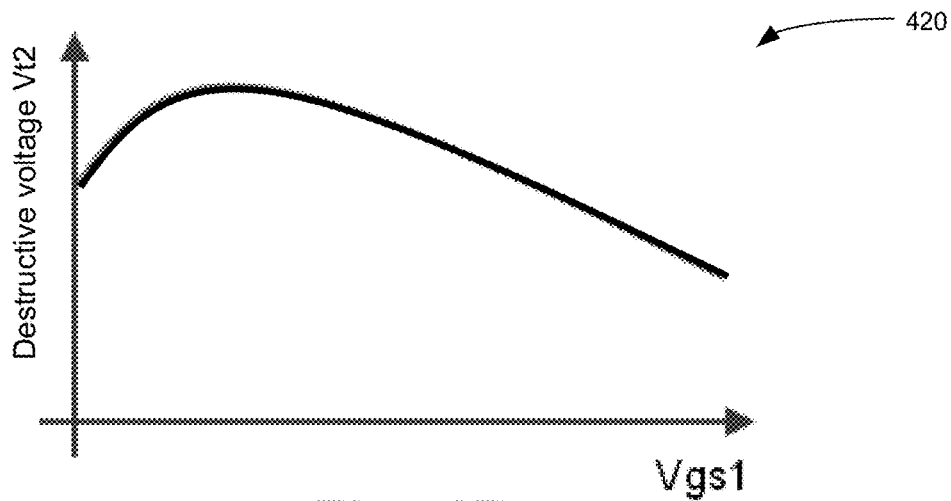
FIG. 4B illustrates a plot showing Vt2 as a function of gate bias for a FinFET device configured to provide local resistance ballast during an ESD event, in accordance with some embodiments.

FIG. 4A illustrates plot 400 showing voltage robustness Vt2 as a function of gate bias for a conventional planar device such as the one used in FIGS. 1A and 1n FIG. 1B. Here, x-axis is Vgs (gate-to-source voltage) across driver transistor MN1 of FIG. 1A or FIG. 1B and y-axis is voltage Vt2. FIG. 4B illustrates plot 420 showing voltage robustness Vt2 as a function of gate bias Vgs1 of MN1 for a FinFET device of FIG. 2 configured to provide local resistance ballast during an ESD event, in accordance with some embodiments. Plot 420 shows an inverse behavior to plot 400, and thus provides move ESD margin (e.g., as Vgs across LGB device MN2 increases, Vt2 decreases after reaching a maximum point).

Figure 5:
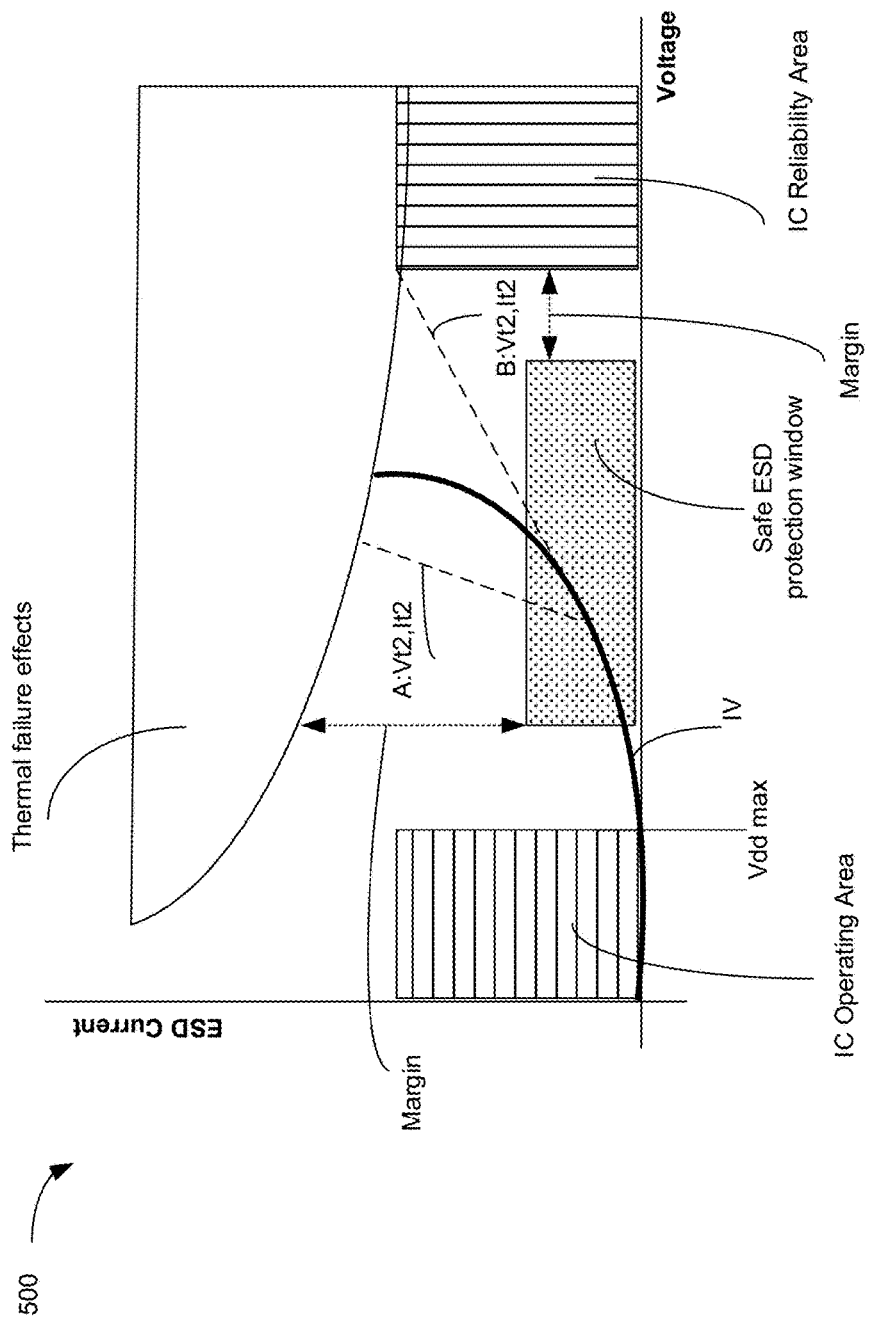
FIG. 5 illustrates a plot showing ESD design window and the benefit of smaller Vt2 achieved from the devices of various embodiments using local ballast elements compared to Vt2 for a traditional planar device.

FIG. 5 illustrates plot 500 showing an ESD design window and the benefit of smaller voltage robustness Vt2 achieved from the devices of various embodiments using local ballast elements compared to voltage robustness Vt2 for a traditional planar device. Here, x-axis is voltage and y-axis is ESD Current. Plot 500 shows the safe ESD protection area between IC operating area, IC reliability area, and thermal failure effects area. The margins for designing within the ESD design window is shown by the double arrow lines. Given these constraints, it is challenging to design an ESD protection circuit. The local ballast based design of various embodiments achieves the IV curve 'A' while the conventional discrete resistor ballast designs of FIGS. 1A-B achieve the IV curve 'B'. The local ballast based design of the various embodiments provides passage for higher ESD current (thus better ESD performance) with reference to the voltage compared to the conventional discrete resistor ballast design of FIGS. 1A-B.

Figure 6:
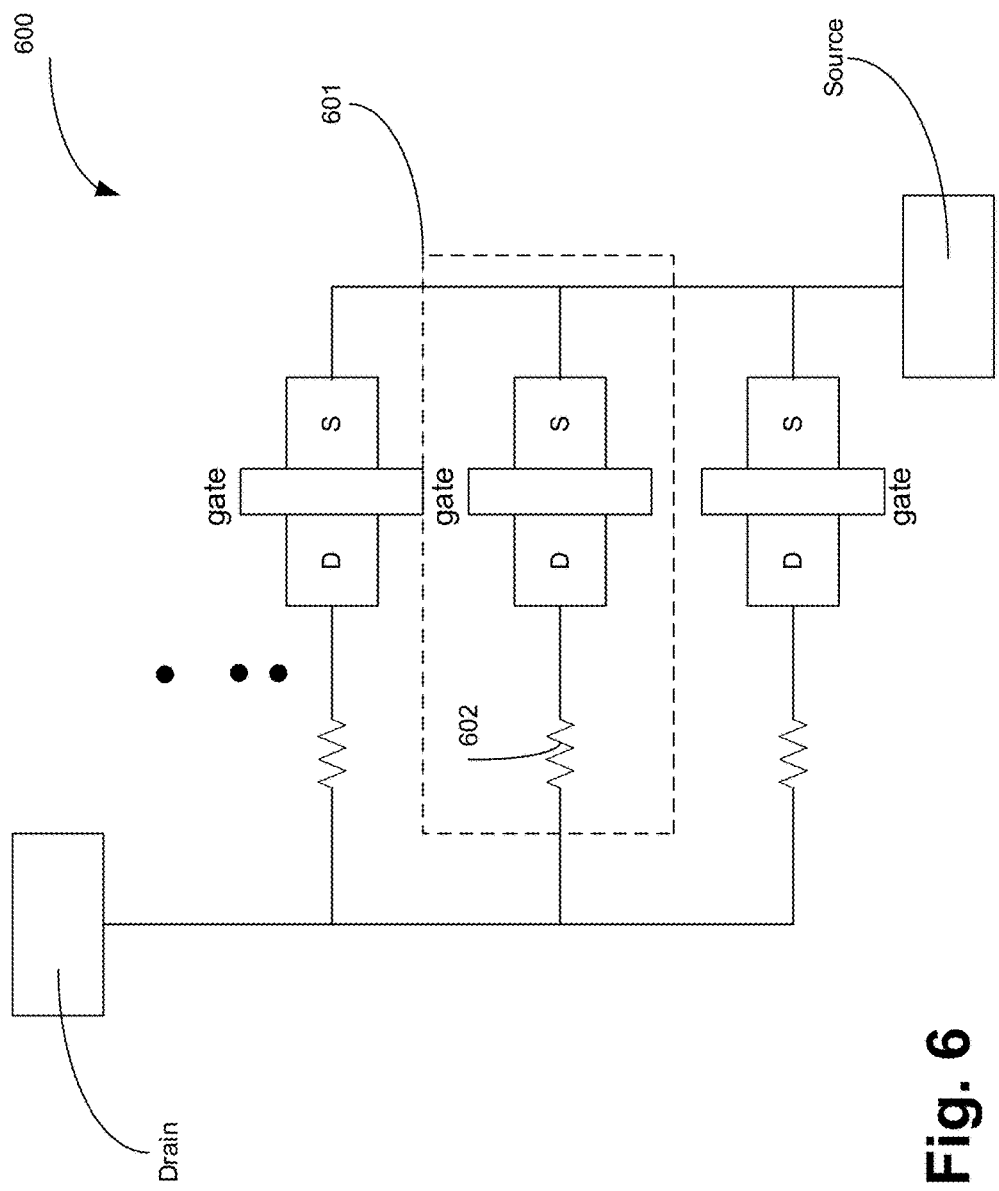
FIG. 6 illustrates a high level schematic of local ballasting of Metal Oxide Semiconductor Field Effect Transistor (MOSFET), in accordance with some embodiments of the disclosure.

FIG. 6 illustrates a high level schematic 600 of local ballasting of Metal Oxide Semiconductor Field Effect Transistor (MOSFET), in accordance with some embodiments of the disclosure. It is pointed out that those elements of FIG. 6 having the same reference numbers (or names) as the elements of any other figure can operate or function in any manner similar to that described, but are not limited to such.

In some embodiments, local ballast resistor 602 is intimately coupled to a drain terminal of a transistor block to form a local ballast element 601. A number of local ballast elements can be coupled in parallel such that the source terminals of each transistor of the ballast elements form a common source terminal while one terminal of the local ballast resistors of each ballast element forms a common drain terminal. In some embodiments, local ballast resistor 602 is an LGB device. In some embodiments, local ballast resistor 602 is a TCN/GCN based resistor, where GCN is a gate contact layer. Here, GCN layer is any suitable layer below a first metal layer or at the same level as the first metal layer that can be used for connecting various nodes. In this case, local ballast resistor 602 is placed in series with each of the transistor blocks. In some embodiments, for local source ballasting, the resistor would connect to ground and not to the pad.

Figure 7A:
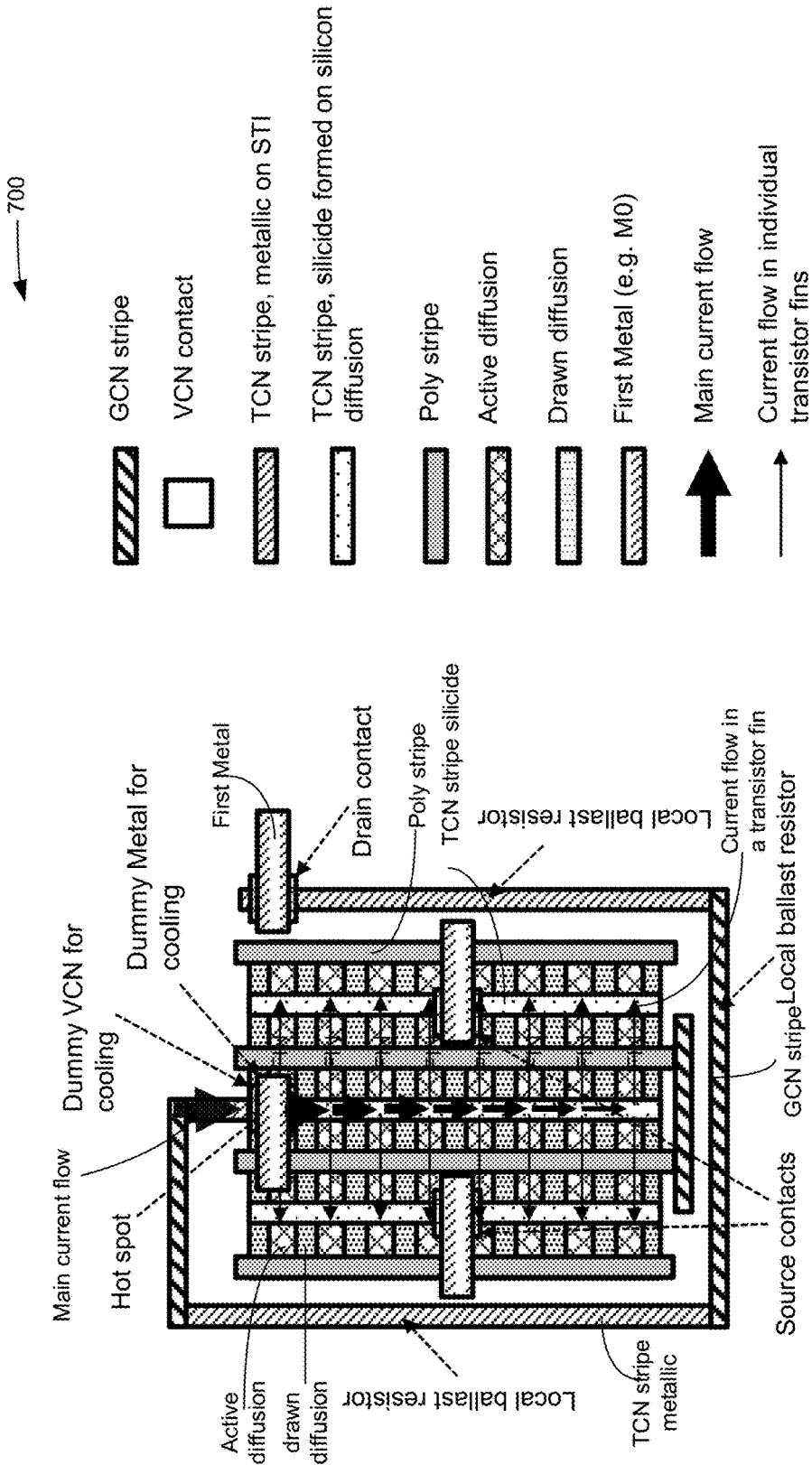
FIG. 7A illustrates a top view of a layout showing a local ballast resistor formed using trench contact (TCN) layer and gate contact (GCN) layer, in accordance with some embodiments.

FIG. 7A illustrates a top view 700 of a layout showing a local ballast resistor formed using TCN layer and GCN layer, in accordance with some embodiments. It is pointed out that those elements of FIG. 7A having the same reference numbers (or names) as the elements of any other figure can operate or function in any manner similar to that described, but are not limited to such.

Top view 700 illustrates a multi-fin FinFET block with a local ballast resistor formed of TCN metallic strips and GCN layers. The ballast resistor may comprise TCN and/or GCN material and may extend in different shapes (e.g., semi-loop, loop, straight line, etc.) before being contacted through vias to the above metal layers. These various structural mechanisms for ballasting exploit TCN/GCN materials both, in reacted form (i.e., silicide) and in non-reacted form (i.e., metallic). Being in immediate contact to the physical transistor block (e.g., each local drain region), this LBR (local ballast resistor) is more effective than the discrete resistor template connected by a metal line to the drain regions of multiple transistor blocks as shown with reference to FIGS. 1A-B.

Figure 7B:
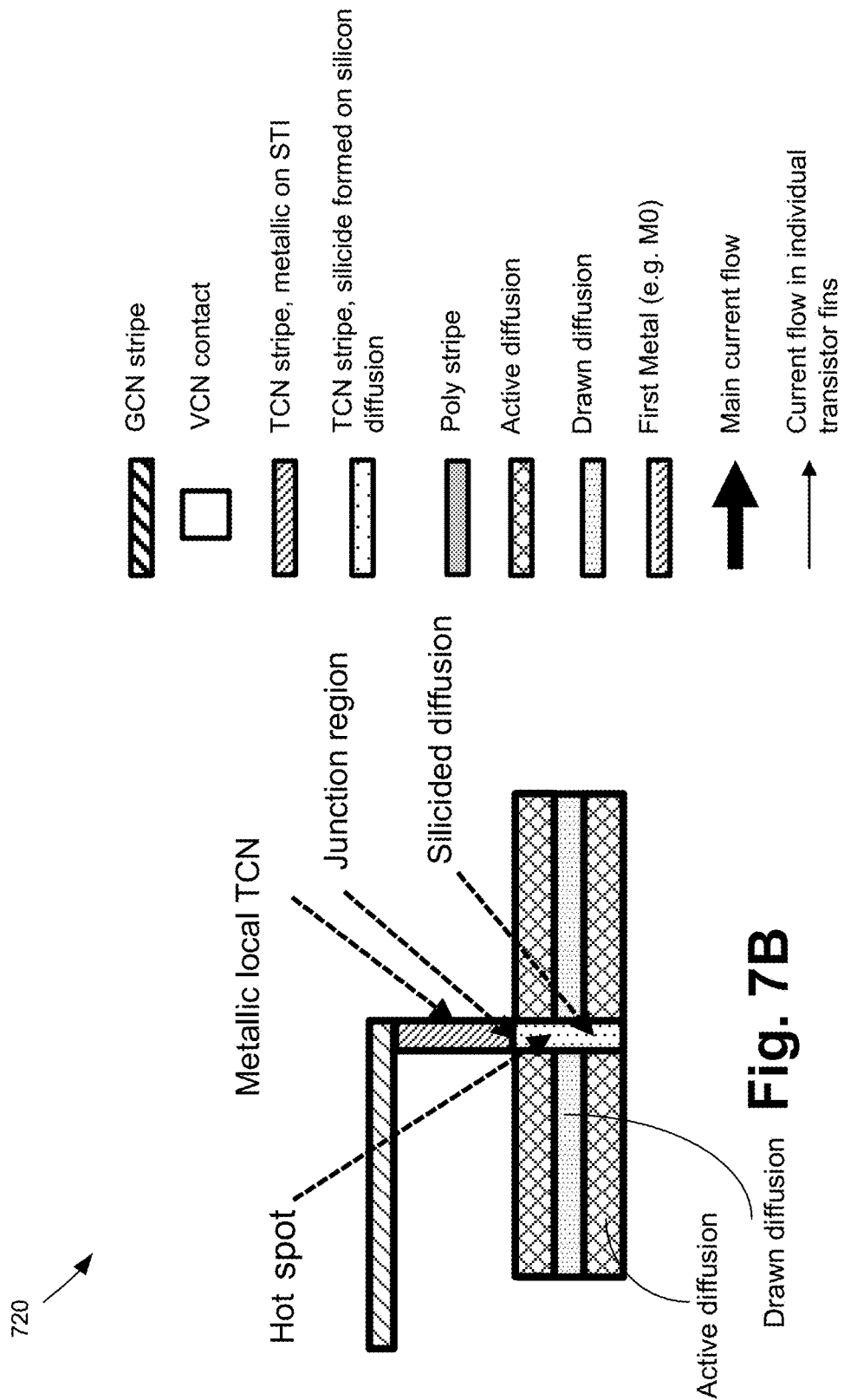
FIG. 7B illustrates a portion of the side view of FIG. 7A showing the hot spot and region where a dummy via is added for cooling, in accordance with some embodiments.

Referring back to FIG. 7A, here, the TCN and GCN layers are coupled in a loop to form a ballast resistor such that one end of the ballast resistor forms a drain contact (which is coupled to a higher metal layer (e.g., M0)). In some embodiments, the second terminal of the ballast resistor is additionally coupled to a dummy via contact (e.g., VCN contact). Here, VCN layer is any suitable layer that can be used for providing a via function. In some embodiments, the VCN contact is coupled to a segment of a higher metal layer (e.g., M0). The VCN contact coupling the ballast resistor loop is placed on top of or in direct vicinity to the hot spot of this layout. It is expected that the strongest heating may be at the interface of the dummy VCN contact and the TCN layer over STI (e.g., deposited metal composite) and TCN over diffusion (e.g., temperature-sensitive silicide). FIG. 7B illustrates a portion 720 of the top view 700 of FIG. 7A showing the hot spot and region where a dummy via will be (not shown in FIG. 7A) added for cooling, in accordance with some embodiments.

Referring back to FIG. 7A, in some embodiments, the VCN contact and associate metal layer or metal stub (e.g., M0) provides cooling to the hot spot which would otherwise break down (e.g., by electro-migration or thermal breakdown of the transistor). In some embodiments, additional dummy metals can be stacked with corresponding vias on top of the dummy VCN contact for further cooling on top of the dummy VCN contact/via. The vertical arrows along the diffusion show the density of the current. For example, the larger arrow of the top implies large current and smaller arrows imply smaller current. The horizontal arrows along the active diffusion regions represent current in the individual fins. Other elements of layout 700 include poly strips, TCN strips (or layers) formed on silicon diffusion. By intimately integrating the ballast resistor as TCN and/or GCN layers, there may be no need for discrete ballast resistor as shown in FIGS. 1A-B.

Figure 8:
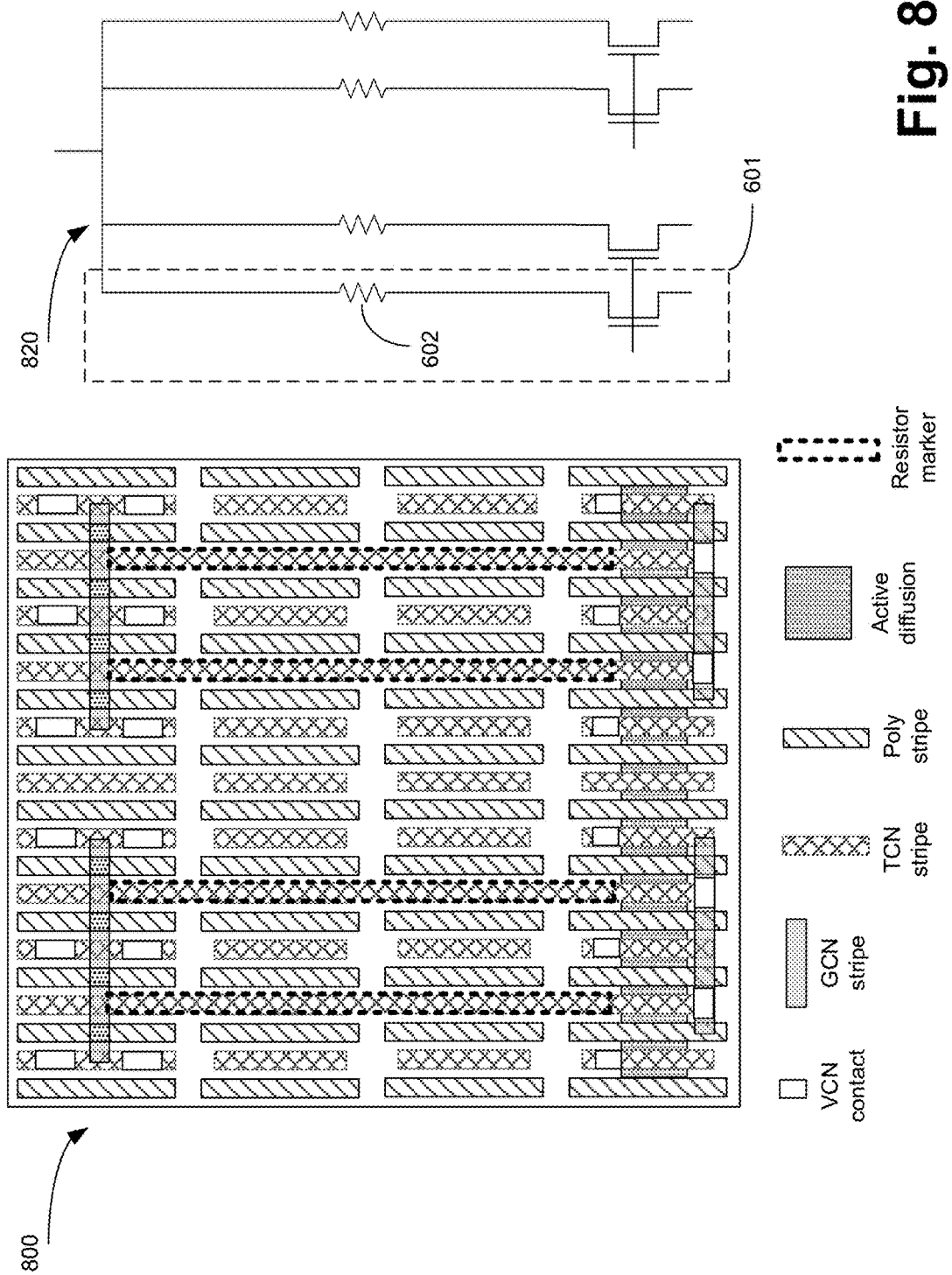
FIG. 8 illustrates a layout and corresponding schematic for a compact ESD MOSFET with local ballast, according to some embodiments of the disclosure.

FIG. 8 illustrates layout 800 and corresponding schematic 820 for a compact ESD MOSFET with local ballast, according some embodiments of the disclosure. It is pointed out that those elements of FIG. 8 having the same reference numbers (or names) as the elements of any other figure can operate or function in any manner similar to that described, but are not limited to such.

The various embodiments of using local ballast resistor avoids the metal wiring needed to connect the discrete transistor blocks to individual resistor elements (both often arranged in separate large arrays). Layout 800 is a MOS configuration layout of a local ballast resistor LBR (e.g., 602) with contact lines extended uni-directionally from the contact orientation (e.g., y-direction) on the transistor, in accordance with some embodiments. The extended contact line can be drawn on any existing transistor layout gate pitch resulting in area savings and smallest parasitic capacitances are possible. In some cases, the TCN is extended over (usually dummy) diffusion regions, a desired increased resistance compared to TCN over STI gets created due to silicide regions formed by the TCN material being on contact with silicon diffusion. The corresponding schematic 820 shows the four MOS transistors of layout 800 and their associated local ballast resistor 602 (note that the transistor and the resistor are grouped as 601).

Figure 9:
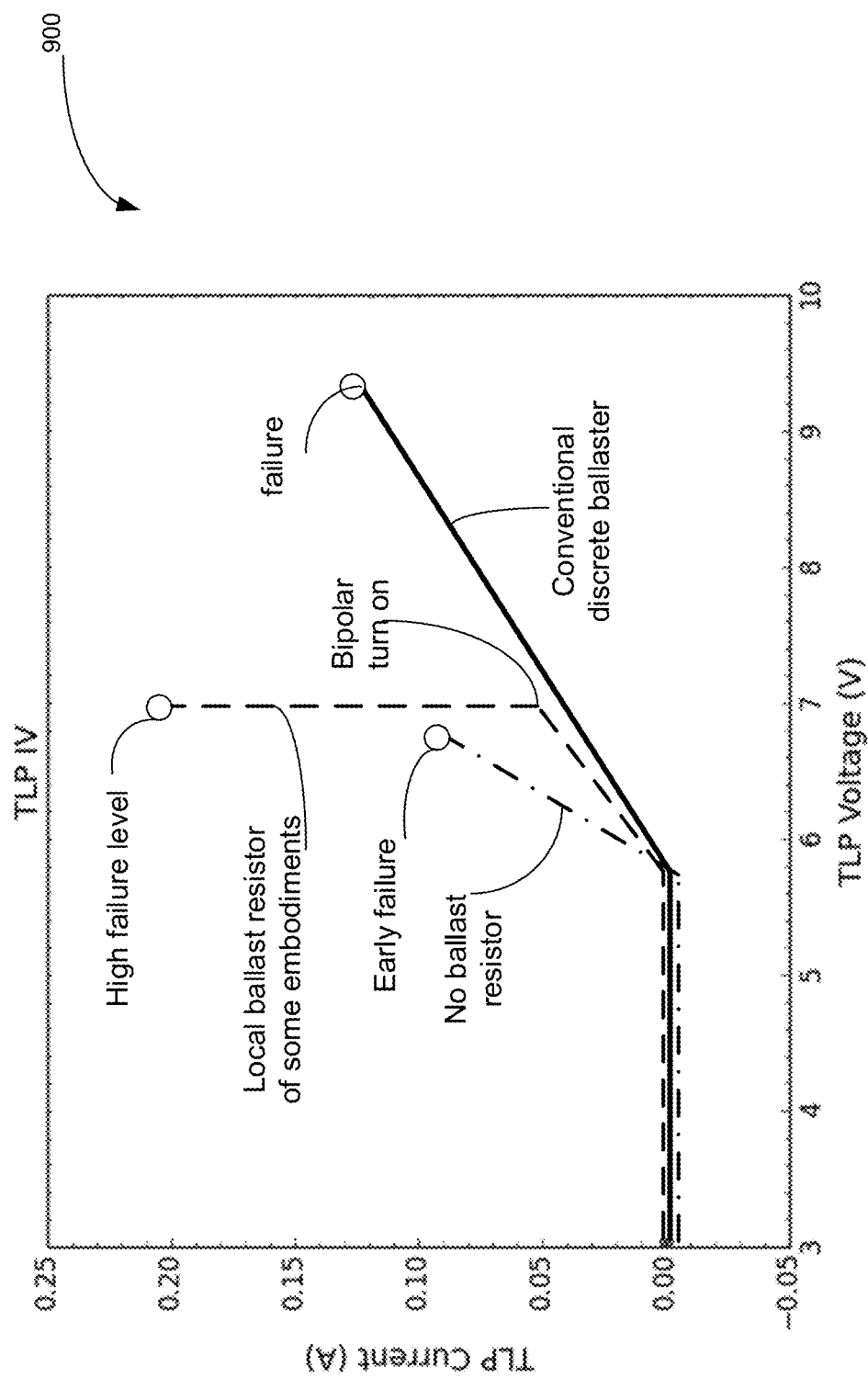
FIG. 9 illustrates a plot showing effectiveness of the local ballast elements compared to conventional discrete resistors, in accordance with some embodiments of the disclosure.

FIG. 9 illustrates plot 900 showing effectiveness of the local ballast elements compared to conventional discrete resistors, in accordance with some embodiments of the disclosure. Here, x-axis is Transmission-Line Pulse (TLP) voltage (in Volts (V)) and y-axis is TLP Current (in Amperes (A)).

Plot 900 shows three IV characteristics. The solid line is for conventional discrete ballast resistor as described with reference to FIGS. 1A-B. The regular dashed line is the IV curve for the case using local ballast resistor of the various embodiments. The dashed-dot curve is an IV curve when no ballast resistor for an IO driver. Both the cases of conventional discrete ballast resistor and no ballast resistor show early failure. Plot 900 demonstrates the effectiveness of using local ballast elements (LBE) applied to GGNMOS transistors, here shown for local ballasting resistance (LBR). The IV-slope can be tuned like with conventional ballasting (e.g., up to 7V/0.05 mA) but then the additional advantage becomes clear—strong bipolar action is enabled by avoiding localized early failure and pushing It2 up which is in contrast to conventional ballasting or in contrast to no ballasting. The embodiments allow usage of the LBR-hardened devices either as local ESD clamps and/or as ESD-robust drivers. The LBR of various embodiments saves layout area and also reduces parasitic capacitance.

Figure 10:
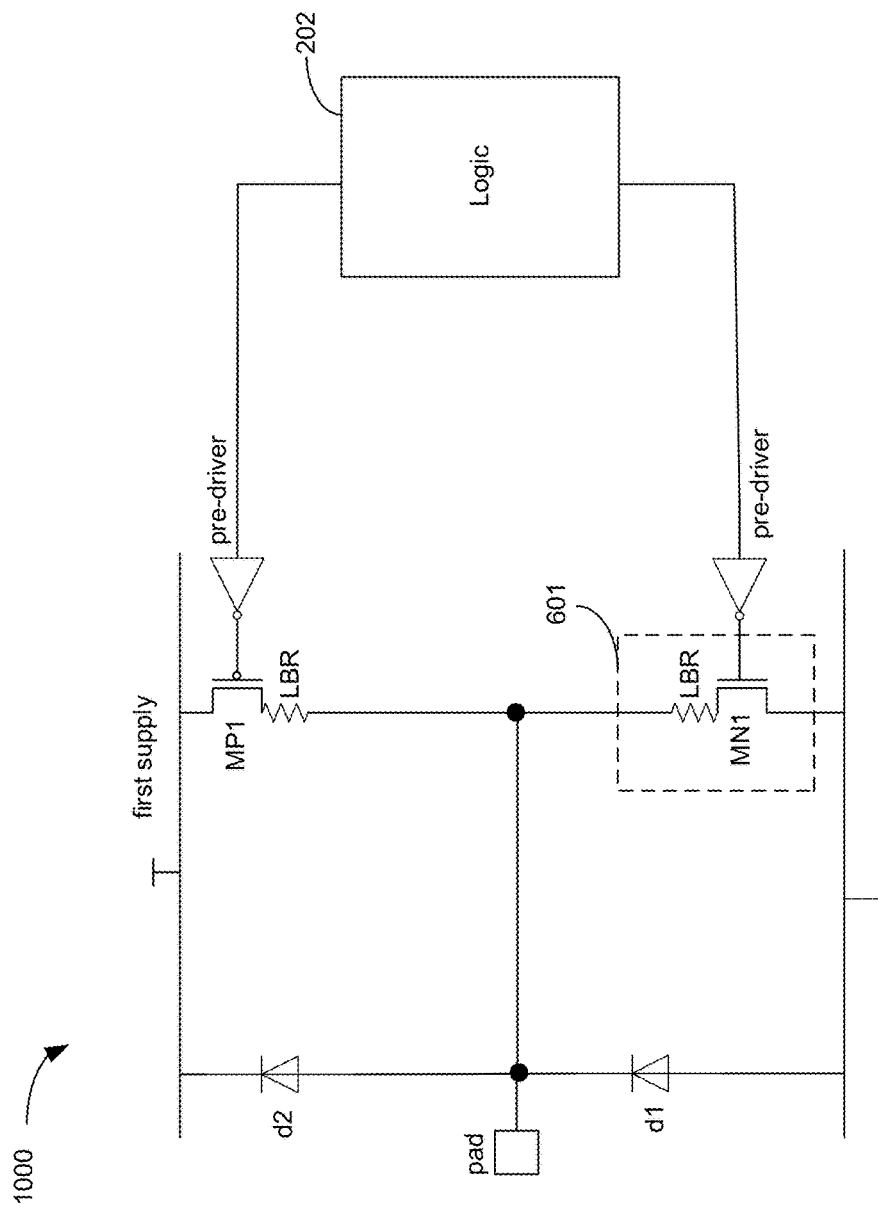
FIG. 10 illustrates a part of an ESD resistant IO driver showing transistors using local ballast elements, in accordance with some embodiments of the disclosure.

FIG. 10 illustrates part of ESD resistance IO driver 1000 showing transistors using local ballast elements, in accordance with some embodiments of the disclosure. It is pointed out that those elements of FIG. 10 having the same reference numbers (or names) as the elements of any other figure can operate or function in any manner similar to that described, but are not limited to such. The ESD robust driver 1000 is similar to FIG. 2 except that the self-biasing circuit is removed, the LBG devices MP2 and MN2 are removed (and so the corresponding transistors MP3 and MN3 are removed too) and transistors MP1 and MN1 are replaced with LBR integrated MOS devices (e.g., 601). Functionally, ESD robust driver circuit 1000 is similar to ESD robust driver circuit 200.

Figure 11:
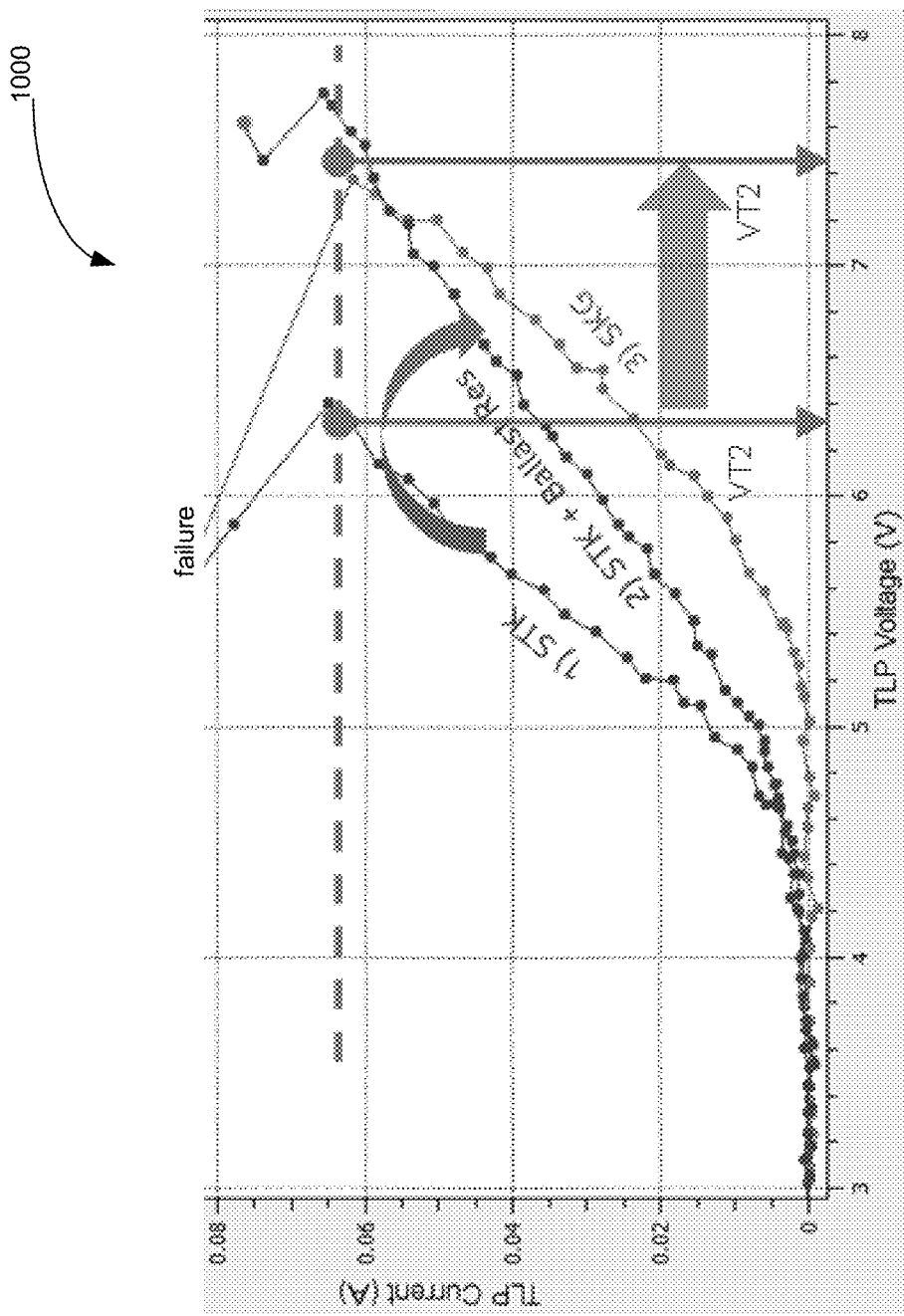
FIG. 11 illustrates a plot showing improvement in Vt2 using local ballast elements that result in smaller layout footprint, in accordance with some embodiments of the disclosure.

FIG. 11 illustrates plot 1100 showing improvement in Vt2 using local ballast elements that result in smaller layout footprint, in accordance with some embodiments of the disclosure. Here, x-axis is TLP voltage (V) and y-axis is TLP Current (A). The first IV curve (STK) from the left is of the stacked transistor configuration of FIG. 1B but without the discrete ballast resistor. The second IV curve (i.e., STK+ ballast resistor) from the left is of the stacked transistor configuration of FIG. 1B. The third IV curve (i.e., SKG) is of the LGB based circuit 200 of FIG. 2.

Vt2 increases as expected on stacked transistors once discrete ballast resistance is added (e.g., +0.5 kOhm→+1V in Vt2 for STK→STK+BallastRes). The same Vt2 increase is achieved by Local Ballasting Gate (SKG device) without the use of ballast resistance and hence with significant layout footprint savings. An equivalent Vt2 is achieved. Compared to LBR approach, one advantage of the LGB is the footprint savings of having no ballast resistor at all.

Figure 12:
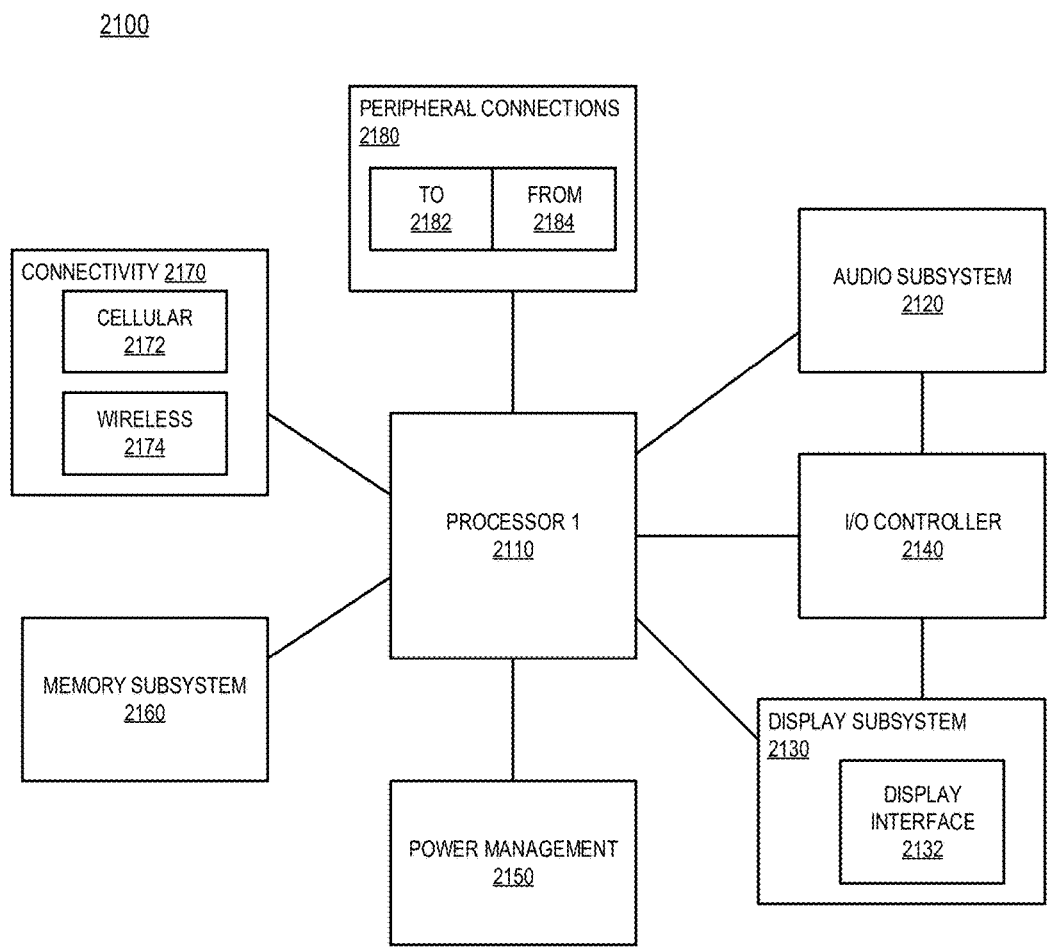
FIG. 12 illustrates a smart device or a computer system or a SoC (System-on-Chip) having an ESD circuit local ballast elements, according to some embodiments.

FIG. 12 illustrates a smart device or a computer system or a SoC (System-on-Chip) having an ESD circuit local ballast elements, according to some embodiments. It is pointed out that those elements of FIG. 12 having the same reference numbers (or names) as the elements of any other figure can operate or function in any manner similar to that described, but are not limited to such.

FIG. 12 illustrates a block diagram of an embodiment of a mobile device in which flat surface interface connectors could be used. For purposes of the embodiments, the transistors in various circuits, modules, and logic blocks are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure.

In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, where each block shown in computing device 2100 is an individual chip, ESD circuits with local ballast elements are provided at the pads (coupled to pins) of the individual chip. In some embodiments, where the SoC is a single large chip, ESD circuits with local ballast elements are provided at the pads (coupled to the pins) of the SoC.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The various embodiments of the present disclosure may also comprise a network interface within 2170 such as a wireless interface so that a system embodiment may be incorporated into a wireless device, for example, cell phone or personal digital assistant.

The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a pad; a first transistor coupled in series with a second transistor and coupled to the pad; and a self-biasing circuit to bias the first transistor such that the first transistor is to be weakly biased during an electrostatic discharge (ESD) event. In some embodiments, the first and second transistors are n-type FinFETs. In some embodiments, the apparatus comprises a first diode coupled to the pad and the second transistor via a ground node.

In some embodiments, the self-biasing circuit comprises a diode-connected transistor with a source terminal coupled to the first transistor and a drain terminal coupled to a first power supply node. In some embodiments, the apparatus comprises a third transistor coupled in series with a fourth transistor and coupled to the pad. In some embodiments, the third and fourth transistors are p-type FinFETs. In some embodiments, the self-biasing circuit is to bias the third transistor such that the third transistor is to be weakly biased during the ESD event. In some embodiments, the self-biasing circuit comprises a diode-connected transistor with a source terminal coupled to third transistor and a drain terminal coupled to the first power supply node. In some embodiments, the apparatus comprises a second diode coupled to the pad and the fourth transistor via a second power supply node. In some embodiments, the second power supply node is to supply a power higher than a power supplied by the first power supply node. In some embodiments, the third and fourth transistors are p-type FinFETs.

In another example, a system is provided which comprises: an integrated circuit including: an input-output (I/O) pad; and an electrostatic discharge (ESD) circuit coupled to the I/O pad, wherein the ESD circuit comprises: a first transistor coupled in series with a second transistor and coupled to the I/O pad; and a self-biasing circuit to bias the first transistor such that the first transistor is to be weakly biased during an ESD event; and an interface allowing the integrated circuit to communicate with another device.

In some embodiments, the self-biasing circuit comprises a diode-connected transistor with a source terminal coupled to the first transistor and a drain terminal coupled to a first power supply node. In some embodiments, the ESD circuit comprises an apparatus to the apparatus described above.

In another example, an apparatus is provided which comprises: a first transistor; and a first local ballast resistor formed of a trench contact (TCN) layer, the first local ballast resistor having a first terminal coupled to either the drain or source terminal of the first transistor. In some embodiments, the first transistor is an n-type FinFET, and wherein a source terminal of the transistor is coupled directly or indirectly to a ground node. In some embodiments, the first local ballast resistor has a second terminal coupled to a pad.

In some embodiments, the first local ballast resistor is coupled to a dummy via contact node (VCN) for cooling. In some embodiments, the dummy via is coupled to a metal stub. In some embodiments, the apparatus comprises: a second transistor, and a second local ballast resistor formed of a TCN layer, the second local ballast resistor having a first terminal coupled to either drain or source terminals of the second transistor. In some embodiments, the second transistor has a source terminal which is directly or indirectly coupled to a power supply node, and wherein the second local ballast resistor has a second terminal coupled to the pad, wherein the second local ballast resistor is coupled to a dummy via contact node (VCN) for cooling, and wherein the dummy via is coupled to a metal stub. In some embodiments, resistance of the first local ballast resistor increases when the TCN is extended over one or more diffusion regions.

In another example, a system is provided which comprises: a memory; a processor coupled to the memory, the processor having an apparatus according to the apparatus described above; and a wireless interface for allowing the processor to communicate with another device.

In another example, a method is provided which comprises: weakly biasing a first transistor, coupled in series with a second transistor and coupled to a pad, during an electrostatic discharge (ESD) event. In some embodiments, the first and second transistors are n-type FinFETs. In some embodiments, the method comprises coupling a first diode to the pad and the second transistor via a ground node.

In another example, an apparatus is provided which comprises: means for weakly biasing a first transistor, coupled in series with a second transistor and coupled to a pad, during an electrostatic discharge (ESD) event. In some embodiments, the first and second transistors are n-type FinFETs. In some embodiments, the apparatus means for coupling a first diode to the pad and the second transistor via a ground node.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a pad;
   a first transistor coupled in series with a second transistor and coupled to the pad; and
   a self-biasing circuit to bias the first transistor such that the first transistor is to be weakly biased during an electrostatic discharge (ESD) event, wherein the self-biasing circuit comprises a diode-connected transistor coupled to the first transistor, wherein the diode-connected transistor has a drain terminal and a gate terminal, and wherein the drain terminal is coupled to the gate terminal.

2. The apparatus of claim 1, wherein the first and second transistors are n-type FinFETs.

3. The apparatus of claim 2, wherein the diode-connected transistor comprises:
   a source terminal coupled to the first transistor; and
   a drain terminal coupled to a first power supply node.

4. The apparatus of claim 1 comprises a first diode coupled to the pad and the second transistor via a ground node.

5. The apparatus of claim 4 comprises a third transistor coupled in series with a fourth transistor and coupled to the pad.

6. The apparatus of claim 5, wherein the third and fourth transistors are p-type FinFETs.

7. The apparatus of claim 6, wherein the self-biasing circuit is to bias the third transistor such that the third transistor is to be weakly biased during the ESD event.

8. The apparatus of claim 7, wherein the self-biasing circuit comprises a second diode-connected transistor with a source terminal coupled to third transistor and a drain terminal coupled to the first power supply node.

9. The apparatus of claim 8 comprises a second diode coupled to the pad and the fourth transistor via a second power supply node.

10. The apparatus of claim 9, wherein the second power supply node is to supply a power higher than a power supplied by the first power supply node.

11. The apparatus of claim 5 comprises a first pre-driver coupled to a gate terminal of the fourth transistor.

12. The apparatus of claim 11 comprises a fifth transistor coupled in series with a sixth transistor and coupled to the pad, wherein the fifth and sixth transistors are n-type FinFETs.

13. The apparatus of claim 12, wherein the self-biasing circuit is to bias the fifth transistor such that the fifth transistor is to be weakly biased during the ESD event.

14. The apparatus of claim 13 comprises a second pre-driver coupled to a gate terminal of the sixth transistor, wherein the first and second pre-drivers are controlled by a logic circuitry.

15. The apparatus of claim 1, wherein the third and fourth transistors are p-type FinFETs.

16. An apparatus comprising:
a transistor; and
a local ballast resistor formed of a trench contact (TCN) layer, the local ballast resistor having a terminal coupled to either the drain or source terminal of the transistor,
wherein the local ballast resistor is coupled to a dummy via contact node (VCN) for cooling, wherein the dummy via contact node is coupled to a metal stub.

17. The apparatus of claim 16, wherein the transistor is an n-type FinFET, and wherein a source terminal of the transistor is coupled directly or indirectly to a ground node.

18. The apparatus of claim 17, wherein the local ballast resistor has a second terminal coupled to a pad.

19. The apparatus of claim 16, wherein the transistor is a first transistor, wherein the local ballast resistor is a first local ballast resistor, and wherein the apparatus comprises:
a second transistor, and
a second local ballast resistor formed of a TCN layer, the second local ballast resistor having a first terminal coupled to either drain or source terminals of the second transistor.

20. The apparatus of claim 19, wherein the second transistor has a source terminal which is directly or indirectly coupled to a power supply node, and wherein the second local ballast resistor has a second terminal coupled to the pad, wherein the second local ballast resistor is coupled to a dummy via contact node (VCN) for cooling, and wherein the dummy via is coupled to a metal stub.

21. The apparatus of claim 16, wherein resistance of the local ballast resistor increases when the TCN is extended over one or more diffusion regions.

22. A system comprising:
an integrated circuit including:
an input-output (I/O) pad; and
an electrostatic discharge (ESD) circuit coupled to the I/O pad, wherein the ESD circuit comprises:
a first transistor coupled in series with a second transistor and coupled to the I/O pad; and
a self-biasing circuit to bias the first transistor such that the first transistor is to be weakly biased during an ESD event, wherein the self-biasing circuit comprises a diode-connected transistor coupled to the first transistor, wherein the diode-connected transistor has a drain terminal and a gate terminal, wherein the drain terminal is coupled to the gate terminal; and
an interface to allow the integrated circuit to communicate with another device.

23. The system of claim 22, wherein the diode-connected transistor comprises a source terminal coupled to the first transistor and a drain terminal coupled to a first power supply node.

* * * * *